United States Patent
Do et al.

(10) Patent No.: US 9,570,592 B2
(45) Date of Patent: Feb. 14, 2017

(54) METHOD OF FORMING SPLIT GATE MEMORY CELLS WITH 5 VOLT LOGIC DEVICES

(71) Applicant: Silicon Storage Technology, Inc., San Jose, CA (US)

(72) Inventors: Nhan Do, Saratoga, CA (US); Vipin Tiwari, Dublin, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/164,796

(22) Filed: May 25, 2016

(65) Prior Publication Data

US 2016/0359024 A1    Dec. 8, 2016

Related U.S. Application Data

(60) Provisional application No. 62/172,319, filed on Jun. 8, 2015.

(51) Int. Cl.

| | |
|---|---|
| *H01L 21/28* | (2006.01) |
| *H01L 21/265* | (2006.01) |
| *H01L 21/768* | (2006.01) |
| *H01L 29/66* | (2006.01) |
| *H01L 27/115* | (2006.01) |

(52) U.S. Cl.
CPC ....... *H01L 29/66825* (2013.01); *H01L 21/265* (2013.01); *H01L 21/28273* (2013.01); *H01L 21/76895* (2013.01); *H01L 27/11524* (2013.01); *H01L 29/66484* (2013.01)

(58) Field of Classification Search
None
See application file for complete search history.

(56) References Cited

U.S. PATENT DOCUMENTS

| | | | |
|---|---|---|---|
| 5,029,130 A | 7/1991 | Yeh | |
| 2005/0085038 A1* | 4/2005 | Tu | H01L 27/105 438/257 |
| 2006/0099798 A1* | 5/2006 | Nakagawa | H01L 21/28273 438/622 |
| 2007/0063251 A1* | 3/2007 | Tu | H01L 21/28273 257/315 |
| 2008/0050875 A1* | 2/2008 | Moon | H01L 27/105 438/257 |
| 2013/0171814 A1* | 7/2013 | Torii | H01L 21/28273 438/593 |

\* cited by examiner

*Primary Examiner* — Asok K Sarkar
(74) *Attorney, Agent, or Firm* — DLA Piper LLP (US)

(57) ABSTRACT

A method of forming a memory device on a semiconductor substrate having a memory region (with floating and control gates), a first logic region (with first logic gates) and a second logic region (with second logic gates). A first implantation forms the source regions adjacent the floating gates in the memory region, and the source and drain regions adjacent the first logic gates in the first logic region. A second implantation forms the source and drain regions adjacent the second logic gates in the second logic region. A third implantation forms the drain regions adjacent the control gates in the memory region, and enhances the source region in the memory region and the source/drain regions in the first logic region. A fourth implantation enhances the source/drain regions in the second logic region.

11 Claims, 23 Drawing Sheets

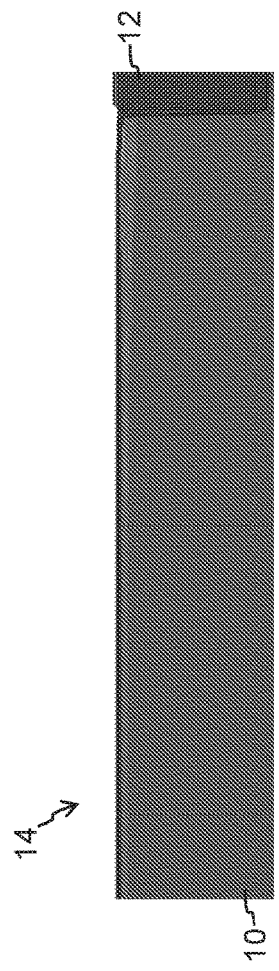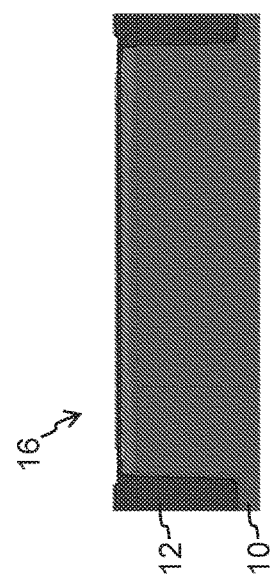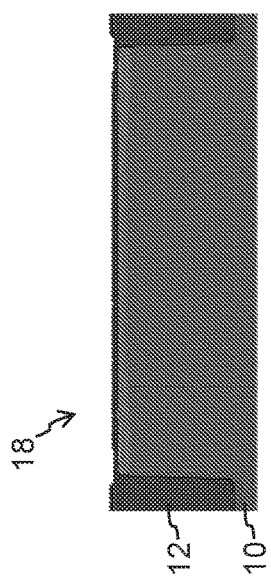
FIG. 1A (Prior Art)
FIG. 1B (Prior Art)
FIG. 1C (Prior Art)

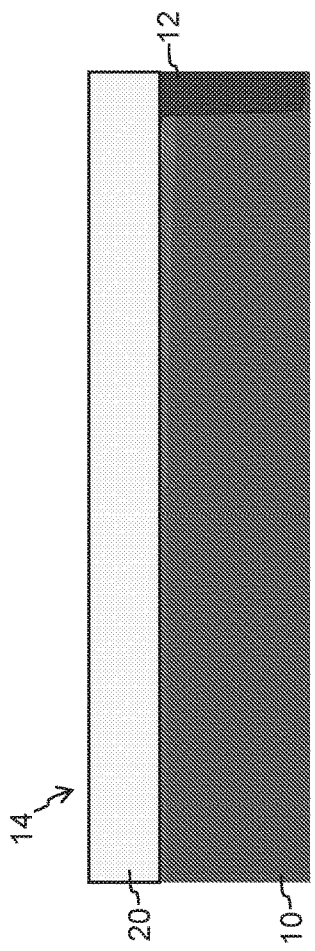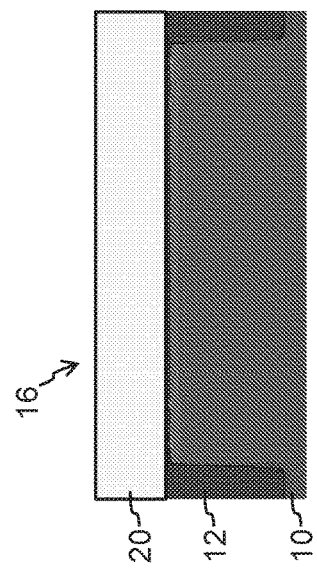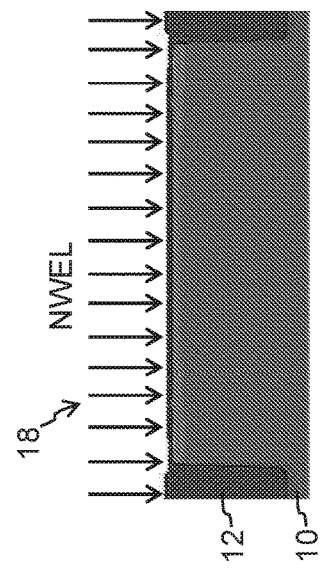
FIG. 2A (Prior Art)
FIG. 2B (Prior Art)
FIG. 2C (Prior Art)

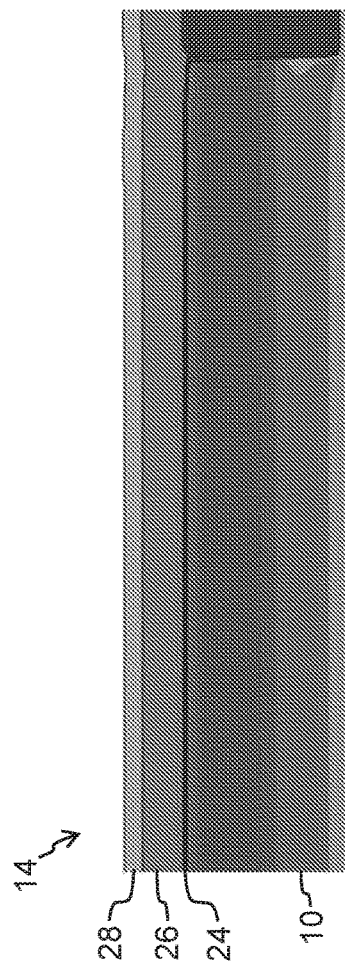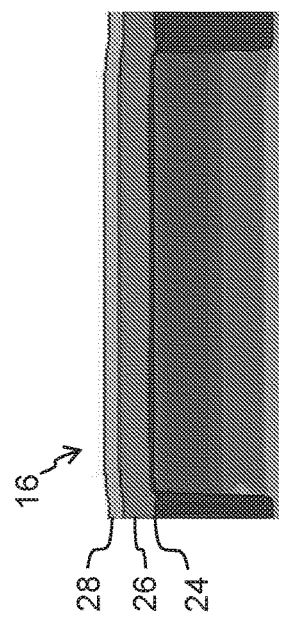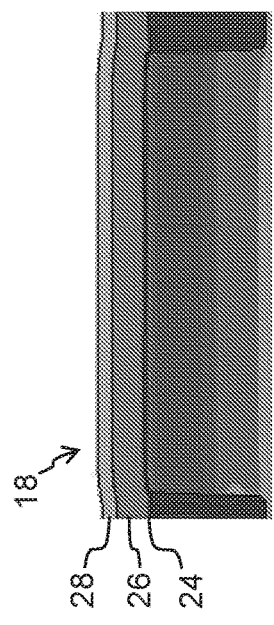
FIG. 4A (Prior Art)
FIG. 4B (Prior Art)
FIG. 4C (Prior Art)

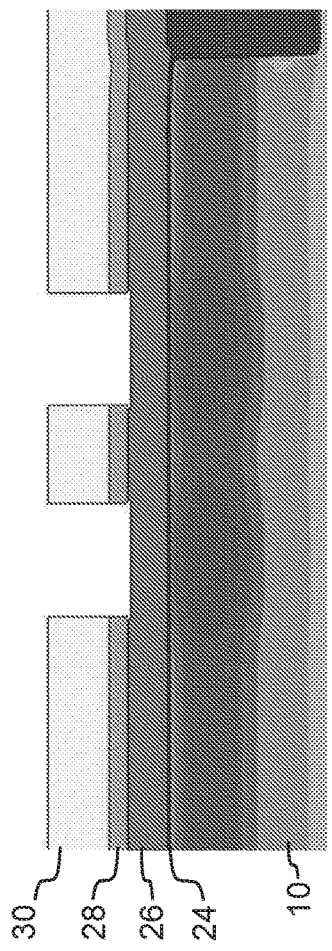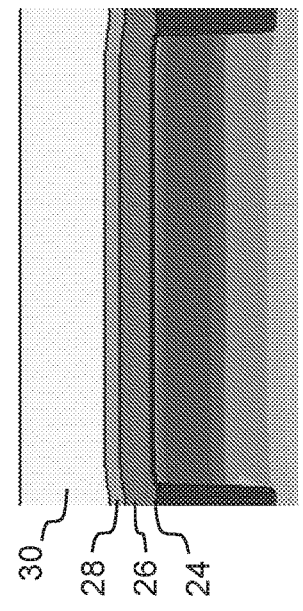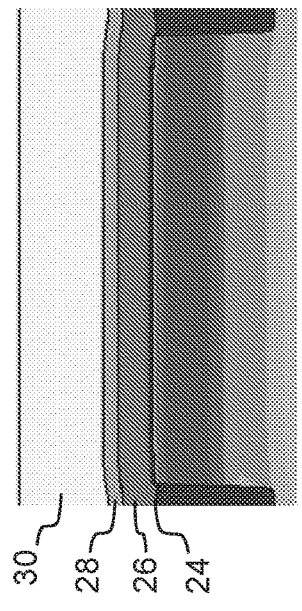
FIG. 5A (Prior Art)
FIG. 5B (Prior Art)
FIG. 5C (Prior Art)

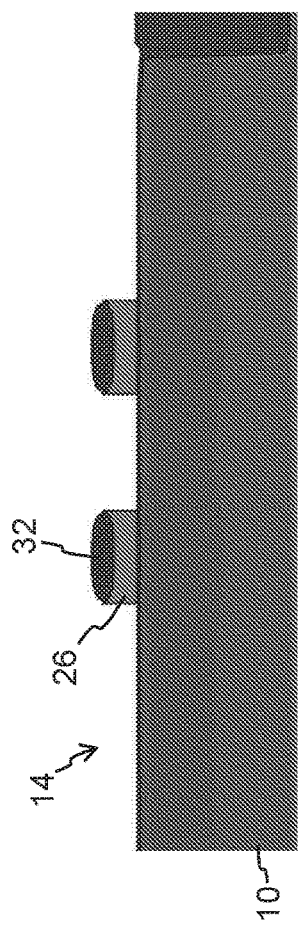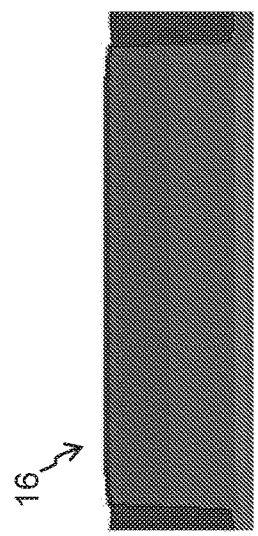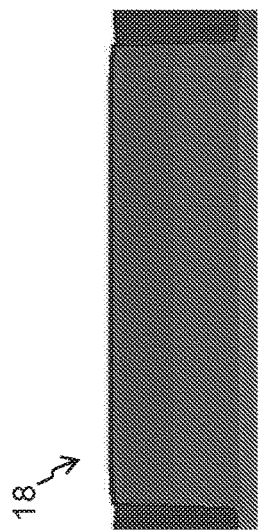
FIG. 7A (Prior Art)
FIG. 7B (Prior Art)
FIG. 7C (Prior Art)

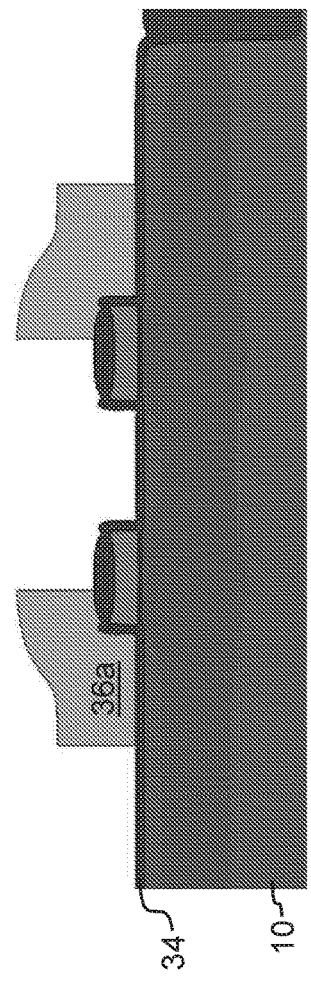
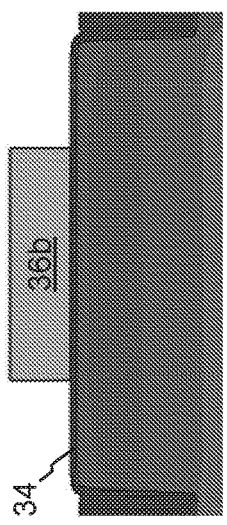
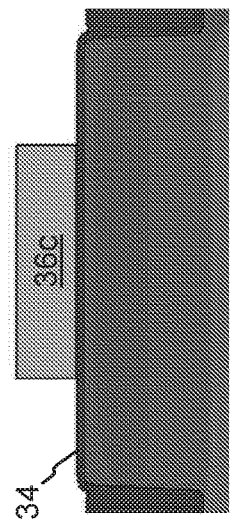
FIG. 8A
(Prior Art)
FIG. 8B
(Prior Art)
FIG. 8C
(Prior Art)

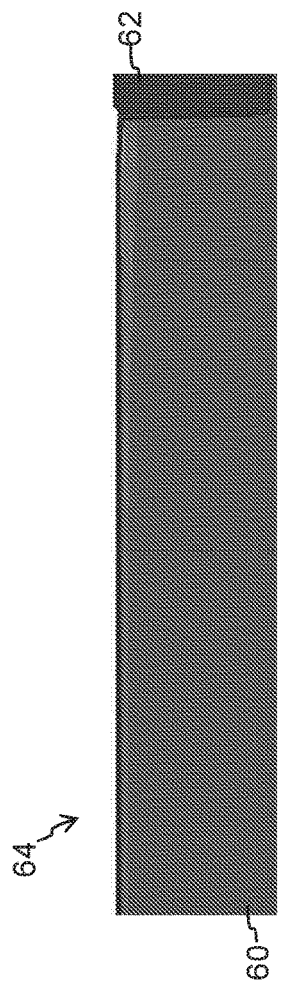
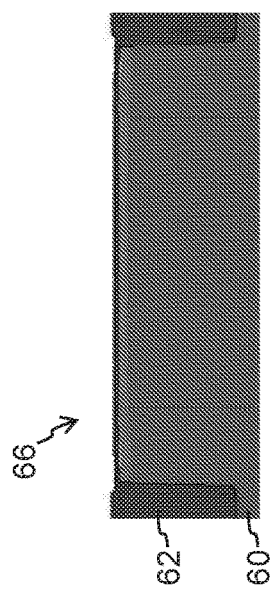
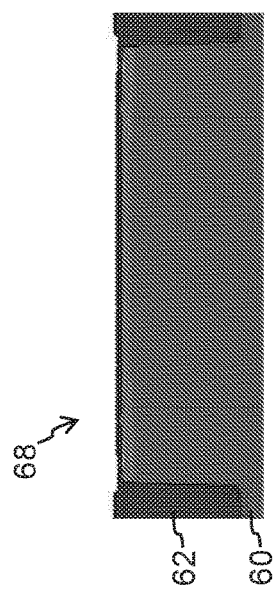
FIG. 11A
FIG. 11B
FIG. 11C

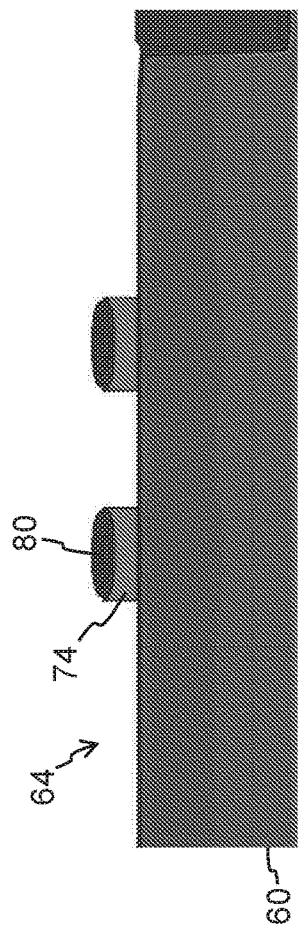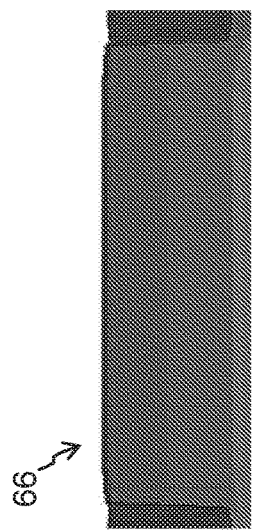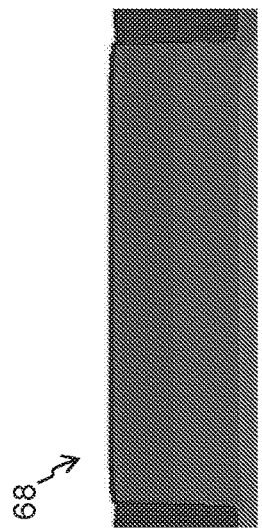
FIG. 16A
FIG. 16B
FIG. 16C

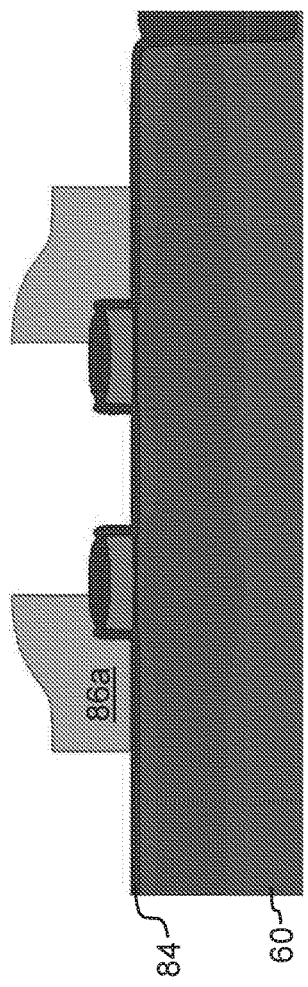
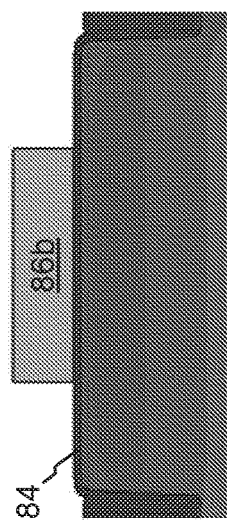
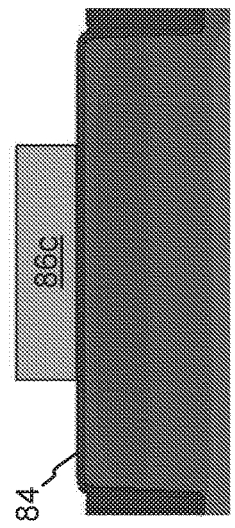
FIG. 18A
FIG. 18B
FIG. 18C

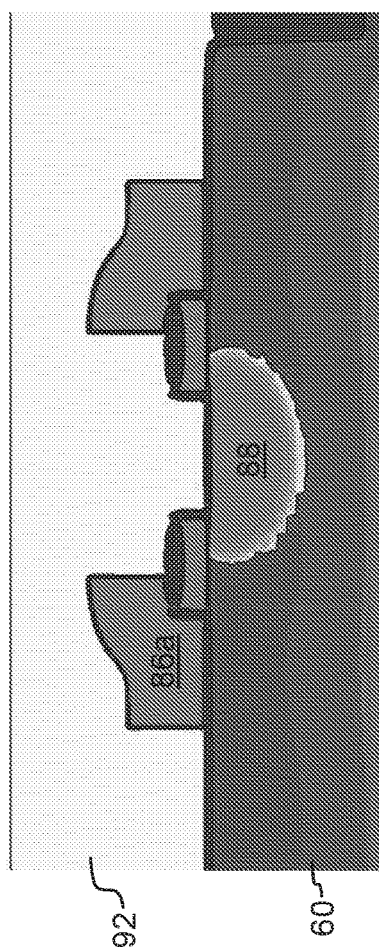
FIG. 20A
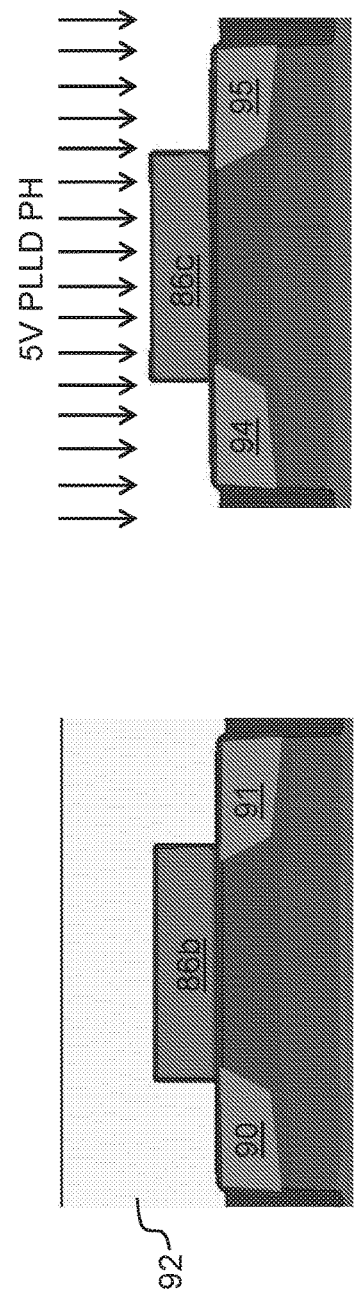
FIG. 20C
FIG. 20B

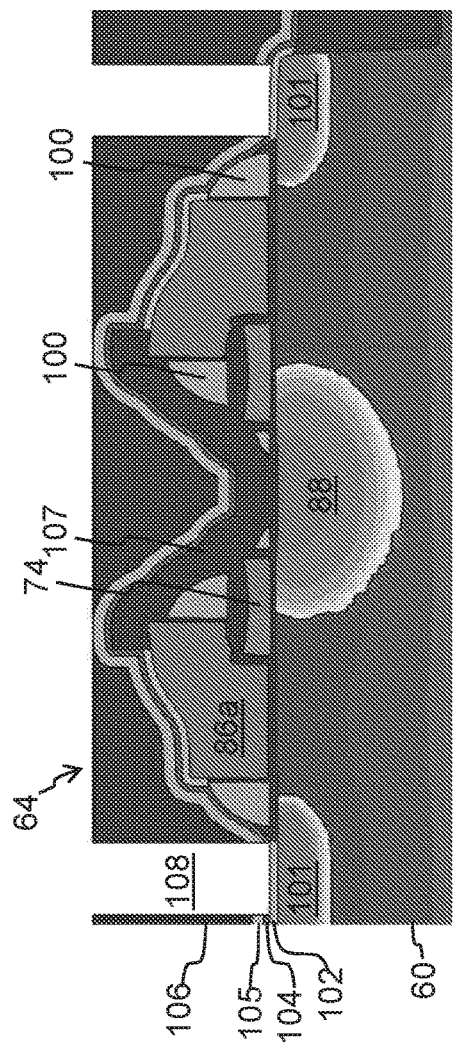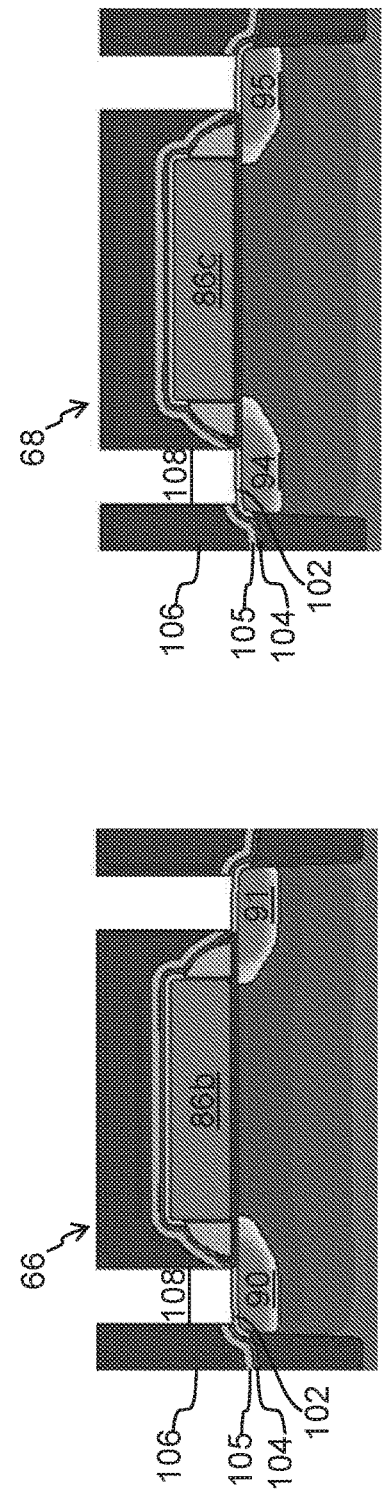

METHOD OF FORMING SPLIT GATE MEMORY CELLS WITH 5 VOLT LOGIC DEVICES

RELATED APPLICATIONS

This application claims the benefit of U.S. Provisional Application No. 62/172,319, filed Jun. 8, 2015, and which is incorporated herein by reference.

FIELD OF THE INVENTION

The present invention relates to non-volatile memory cells, and more particularly to a method of forming such cells on the same wafer as logic devices.

BACKGROUND OF THE INVENTION

Split-gate type memory cell arrays are known. For example, U.S. Pat. No. 5,029,130, which is incorporated herein by reference for all purposes, discloses a split gate memory cell and its formation, which includes forming source and drain regions in the substrate with a channel region there between. A floating gate is disposed over and controls the conductivity of one portion of the channel region, and the control gate is disposed over and controls the conductivity of the other portion of the channel region. The control gate extends up and over the floating gate.

It is also known to form high voltage logic devices on the same wafer (substrate) as the split-gate memory cell array. FIGS. 1A-10A, 1B-10B and 1C-10C show the steps in forming high voltage logic devices (e.g. 12 volt logic devices) on the same wafer as the split gate memory cells. A semiconductor substrate 10 is masked (i.e. photo resist is deposited, selectively exposed using a mask, and selectively removed, using a photolithographic process, leaving portions of the underlying material covered by remaining photo resist while leaving other portions of the underlying material (here the substrate) exposed). The exposed substrate portions are etched away leaving trenches that are then filled with dielectric material 12 (e.g. oxide) to form isolation regions in the memory cell region 14 of the wafer (see FIG. 1A), in the NMOS logic region 16 of the wafer (see FIG. 1B) and in the PMOS logic region 18 of the wafer (see FIG. 1C), all shown after the photo resist is removed. The wafer is then masked again, but this time to cover the NMOS logic and memory cell regions 16 and 14 with photo resist 20, while leaving the PMOS logic region 18 exposed. A high voltage NWEL implant is then performed on the exposed PMOS logic region 18, as shown in FIGS. 2A, 2B and 2C. The photo resist 20 blocks the implantation from the memory cell and NMOS logic regions 14 and 16 of the wafer. The photo resist 20 is removed. The wafer is then masked to cover the PMOS logic region 18 with photo resist 22, but leaving the NMOS logic and memory cell regions 16 and 14 exposed. A high voltage PWEL implant is performed on the exposed NMOS logic and memory cell regions 16 and 14 as shown in FIGS. 3A, 3B and 3C.

After the photo resist 22 is removed, a layer of oxide 24 (FG oxide) is formed on the substrate 10, a layer of polysilicon 26 (FG poly) is formed on oxide 24, and a layer of nitride 28 (FG nitride) is formed on poly layer 24, as shown in FIGS. 4A, 4B and 4C. The wafer is masked, leaving photo resist 30 on the wafer except on selected locations of the nitride 28 which are left exposed in the memory cell region 14. The exposed nitride 28 is etched using an appropriate nitride etch to expose portions of poly layer 26, as shown in FIGS. 5A, 5B and 5C. The exposed portions of the FG poly layer 26 are oxidized using an oxidation process, forming oxide areas 32 on the FG poly 26. FIGS. 6A, 6B and 6C show the resulting structure after the photo resist 30 is removed. A nitride etch is used to remove the remaining nitride layer 28. An anisotropic poly etch is used to remove exposed portions of the poly layer 26, leaving blocks of polysilicon 26 underneath the oxide areas 32 in the memory cell region 14 (which will constitute the floating gates of the memory cells), as shown in FIGS. 7A, 7B and 7C.

An oxide layer 34 is formed over the structure. After additional masking and implant steps (logic NWEL, IO NWEL, logic PWEL, IO PWEL, LLVOX and LVOX), a layer of polysilicon is deposited over the wafer. The structure is masked leaving portions of the poly layer exposed, which are then removed by a poly etch. The remaining portions of the poly layer constitute the control gates 36a in the memory cell region 14, logic gate 36b in the NMOS logic region 16, and logic gate 36c in the PMOS logic region 18. The resulting structure is shown in FIGS. 8A, 8B and 8C (after the photo resist has been removed). The structure is masked again leaving only portions of the memory cell region between pairs of adjacent floating gate poly blocks 26 exposed by photo resist 38. An implantation is performed to form source regions 40 in the portions of the substrate between the floating gate poly blocks 36a, as shown in FIGS. 9A, 9B and 9C.

After the photo resist 38 is removed and after additional masking and implant steps (logic NLDD, IO NLDD, logic PLDD and IO PLDD), the wafer is masked again, leaving the PMOS logic and memory cell regions 18 and 14 covered by photo resist, but leaving the NMOS logic area 16 exposed. An LDD implantation is then performed on the NMOS logic region 16. The photo resist is removed. The wafer is masked again, leaving the NMOS logic and memory cell regions 16 and 14 covered by photo resist, but leaving the PMOS logic region 18 exposed. An LDD implantation is then performed on the PMOS logic region 18. After photo resist removal, the wafer is masked covering portions of the structure with photo resist but leaving the NMOS logic region 16 exposed and those portions of the memory cell region 16 adjacent the control gate poly blocks 36a exposed. An N+ implantation is used to form the source/drain regions 44 and 45 in the NMOS logic region 16 and drain regions 46 in the memory cell region 14. The photo resist is removed. The wafer is masked leaving just the PMOS logic region 18 exposed by photo resist, and a P+ implantation is used to form the source/drain regions 48 and 49 in the PMOS logic region 18.

The photo resist is removed. The process continues by forming insulation spacers 50, silicide layers 52 on the poly blocks 36a, 36b and 36c and on all the source/drain regions, and insulation layers 54-57, as shown FIGS. 10A, 10B and 10C. This back end processing includes at least two more masking steps (silicide blocking to limit silicide formation, and back end processing to create the contacts 58 through the insulation over the drain regions in the memory cell region and over the source/drain regions in the logic device regions).

The above technique produces non-volatile memory cells (each with a source 40, drain 46, floating gate 26, control gate 36a) on the same substrate as high voltage NMOS logic devices (each with a logic gate 36b, source 44 and drain 45) and high voltage PMOS logic devices (each with a logic gate 36c, source 48 and drain 49). It would be desirable to reduce the complexity and cost of manufacturing the memory cells and logic devices, including the number of masking steps used.

BRIEF SUMMARY OF THE INVENTION

The aforementioned problems and needs are addressed by a method of forming a memory device that includes:

providing a semiconductor substrate having a memory region, a first logic region and a second logic region;

forming a pair of spaced apart floating gates in the memory region;

forming a pair of control gates in the memory region, wherein each control gate has a first portion adjacent to one of the floating gates and a second portion that extends up and over one of the floating gates;

forming a first logic gate in the first logic region;

forming a second logic gate in the second logic region;

forming a first photo resist that covers the second logic region and portions of the substrate adjacent to the control gates in the memory region, but not the first logic region and not a portion of the substrate between the pair of floating gates;

performing a first implantation that forms a source region in the substrate between the pair of floating gates, a source region in the substrate adjacent a first side of the first logic gate, and a drain region in the substrate adjacent a second side of the first logic gate opposite the first side of the first logic gate;

removing the first photo resist;

forming a second photo resist that covers the first logic region and the memory region, but not the second logic region;

performing a second implantation that forms a source region in the substrate adjacent a first side of the second logic gate and a drain region in the substrate adjacent a second side of the second logic gate opposite the first side of the second logic gate;

removing the second photo resist;

forming a third photo resist that covers the second logic region, but not the memory region and not the first logic region;

performing a third implantation that forms drain regions in the substrate adjacent the control gates;

removing the third photo resist.

Other objects and features of the present invention will become apparent by a review of the specification, claims and appended figures.

BRIEF DESCRIPTION OF THE DRAWINGS

FIGS. 1A-10A are side cross sectional views illustrating conventional steps for forming memory cells in a memory cell region of the wafer.

FIGS. 1B-10B are side cross sectional views illustrating conventional steps for forming a logic device in an NMOS logic region of the wafer.

FIGS. 1C-10C are side cross sectional views illustrating conventional steps for forming a logic device in a PMOS logic region of the wafer.

FIGS. 11A-23A are side cross sectional views illustrating steps for forming memory cells in a memory cell region of the wafer.

FIGS. 11B-23B are side cross sectional views illustrating steps for forming a logic device in an NMOS logic region of the wafer.

FIGS. 11C-23C are side cross sectional views illustrating steps for forming a logic device in a PMOS logic region of the wafer.

DETAILED DESCRIPTION OF THE INVENTION

It has been discovered that by reducing the operating voltages on the logic devices (i.e. from 12 volts to 5 volts), significant reduction on the complexity and cost of manufacturing the memory cells and logic devices can be achieved. In fact, the number of masking steps can be reduced significantly.

Figure 3A:
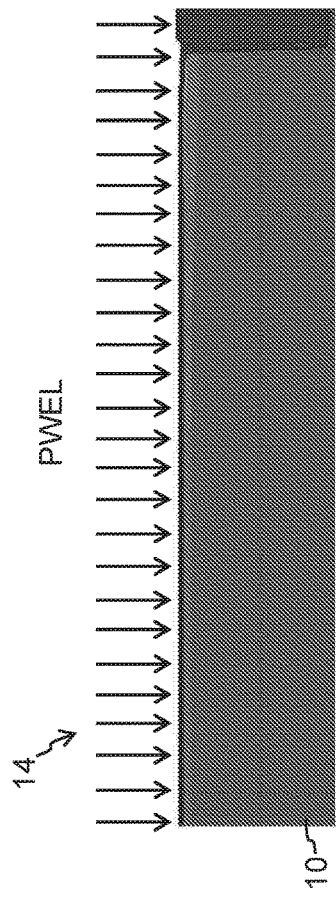
Figure 3B:
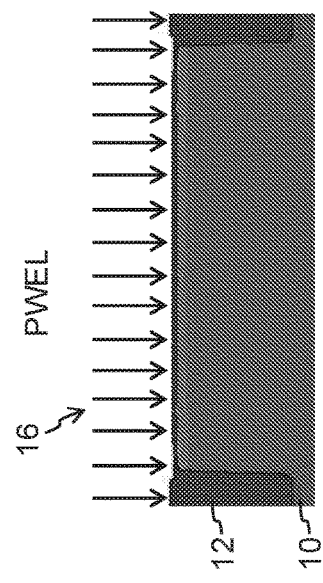
Figure 3C:
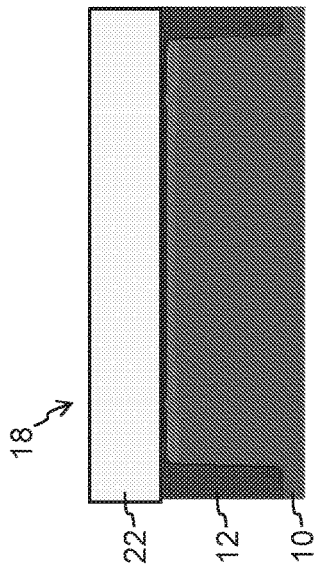
Figure 6A:
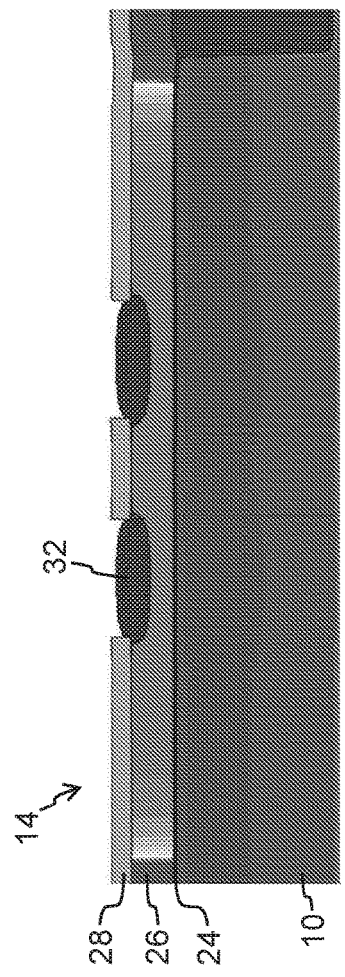
Figure 6B:
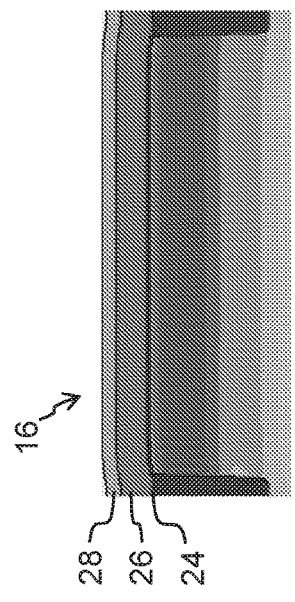
Figure 6C:
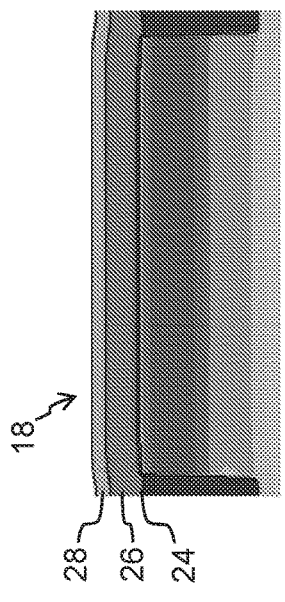
Figure 9A:
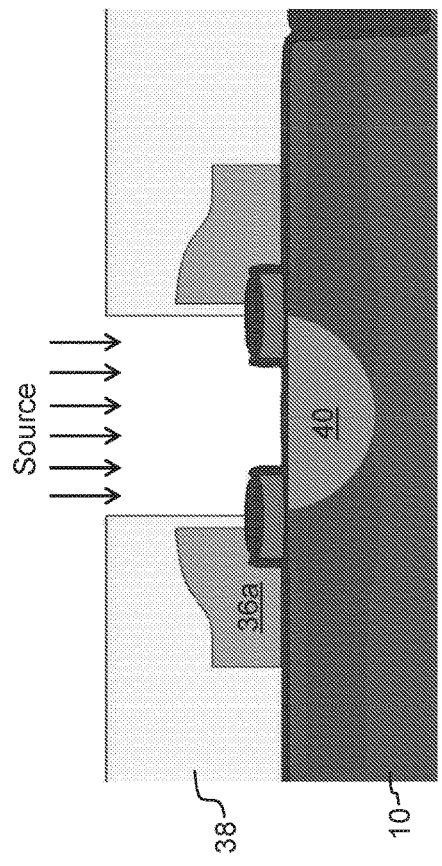
Figure 9B:
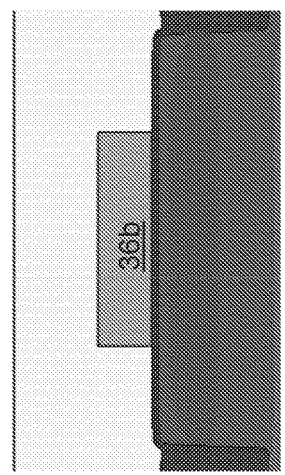
Figure 9C:
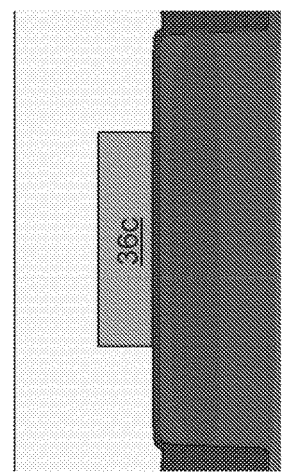
Figure 10A:
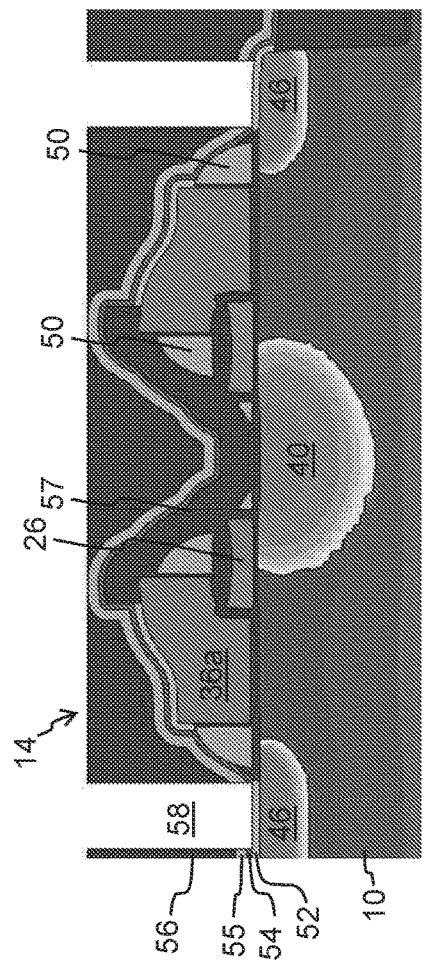
Figure 10B:
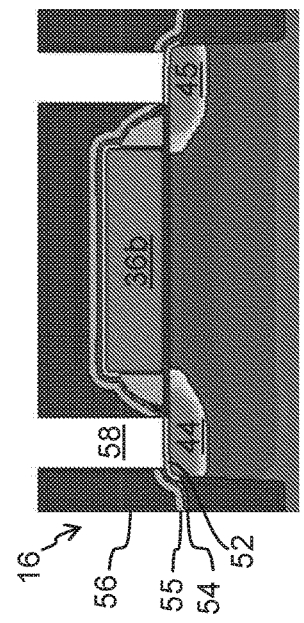
Figure 10C:
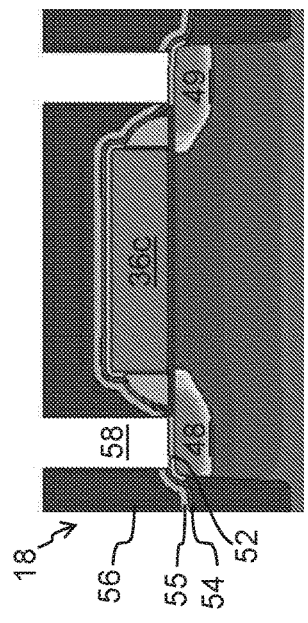
Figure 12A:
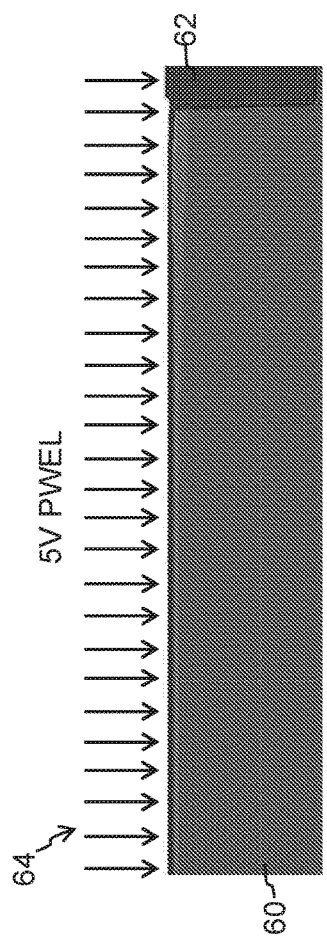
Figure 12B:
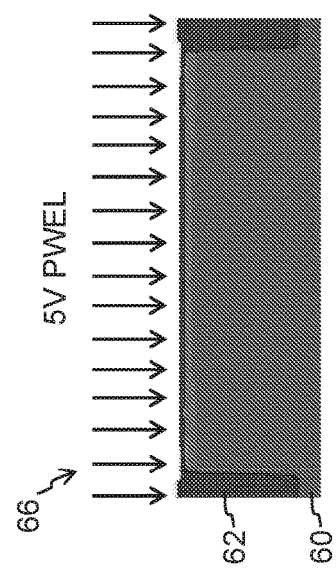
Figure 12C:
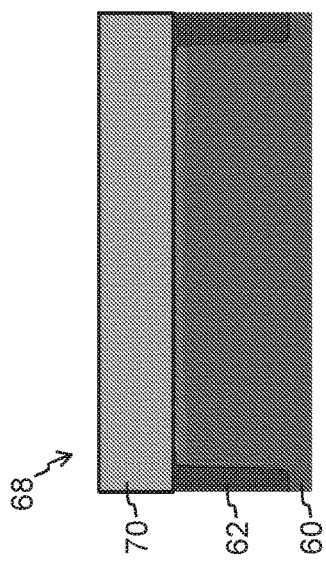

FIGS. 11A-23A, 11B-23B and 11C-23C show the steps in forming high voltage logic devices (e.g. 5 volt logic devices) on the same wafer (substrate) as the split gate memory cells according to the present invention. A semiconductor substrate 60 is masked (i.e. photo resist is deposited, selectively exposed using a mask, and selectively removed, using a photolithographic process, leaving portions of the underlying material covered by remaining photo resist while leaving other portions of the underlying material (here the substrate) exposed). The exposed substrate portions are etched away leaving tranches that are then filled with dielectric material 62 (e.g. oxide) to form isolation regions in the memory cell region 64 of the wafer (see FIG. 11A), in the NMOS logic region 66 of the wafer (see FIG. 11B) and in the PMOS logic region 68 of the wafer (see FIG. 11C). After the photo resist is removed, the wafer is then masked again, but this time to cover the PMOS logic region 68 with photo resist 70, but leaving the memory cell and NMOS logic regions 64 and 66 exposed. A 5V PWEL implant is then performed on the exposed memory cell and NMOS logic regions 64 and 66 (e.g., to form P-wells in the N type substrate in the memory cell region 64 and NMOS logic region 66), as shown in FIGS. 12A, 12B and 12C. The photo resist blocks the implantation from the PMOS logic region 68 of the wafer.

Figure 13A:
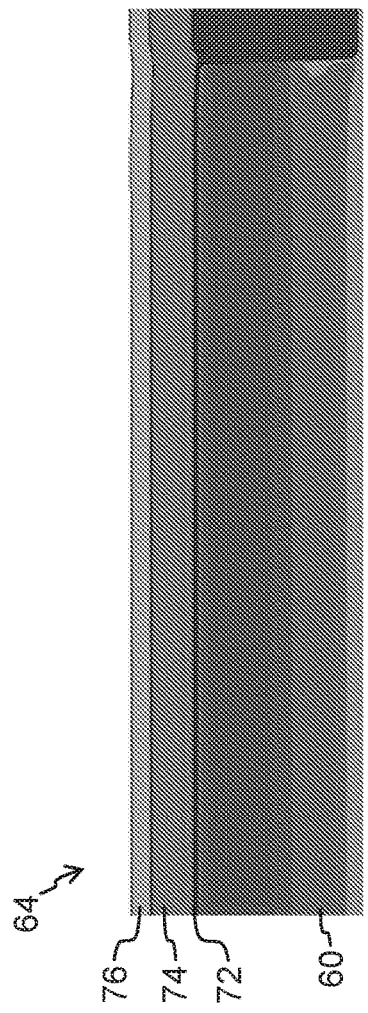
Figure 13B:
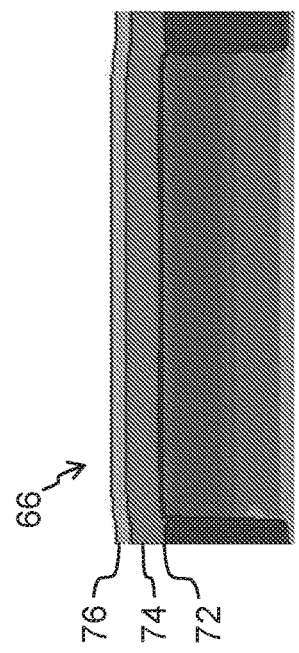
Figure 13C:
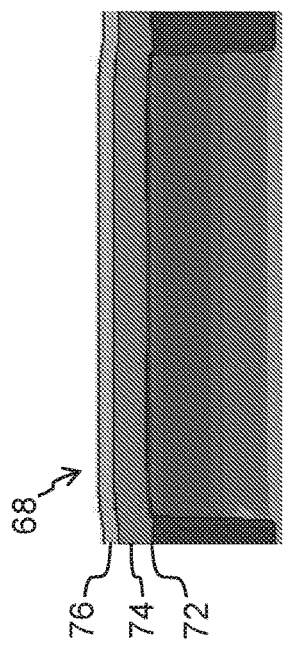
Figure 14A:
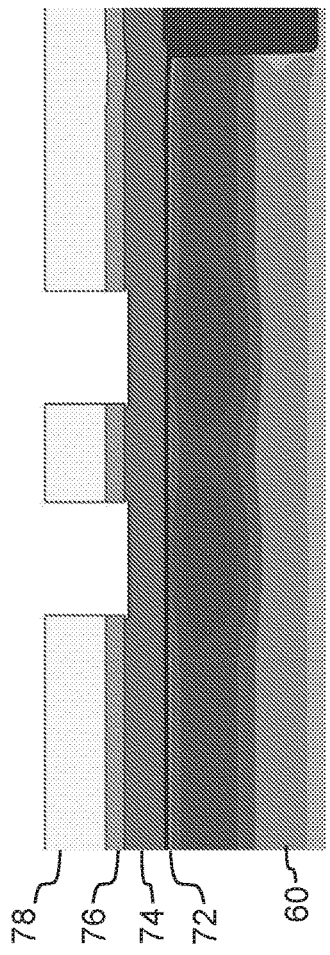
Figure 14B:
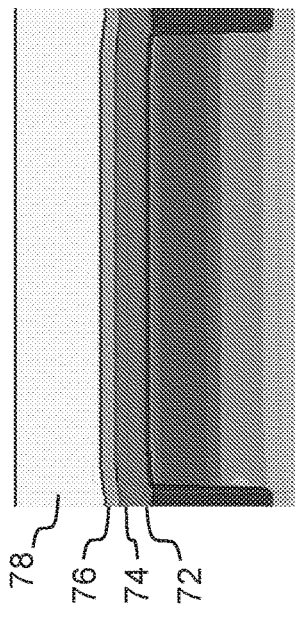
Figure 14C:
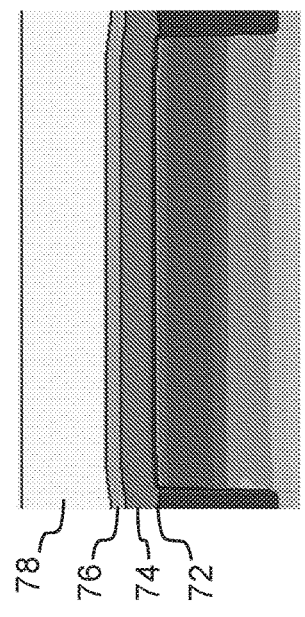
Figure 15A:
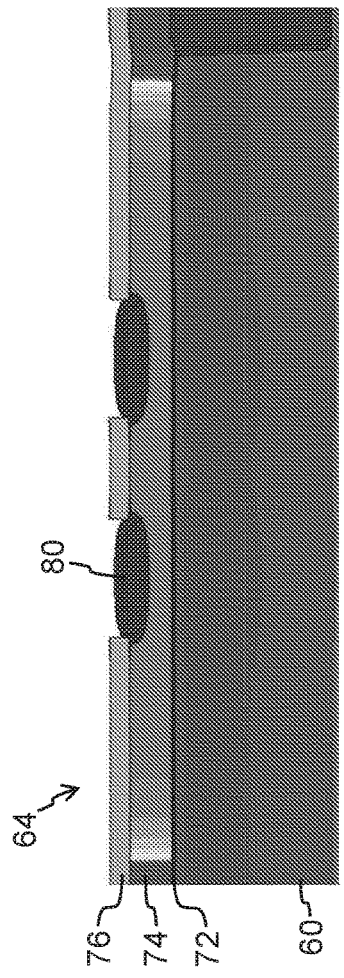
Figure 15B:
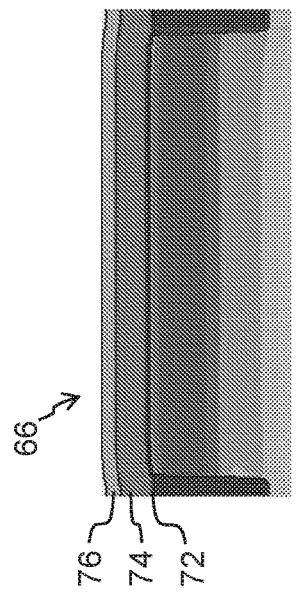
Figure 15C:
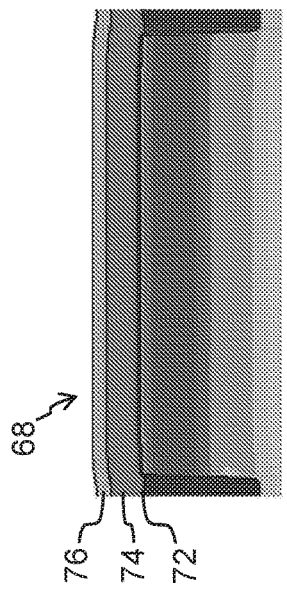

After the photo resist 70 is removed, a layer of oxide 72 (FG oxide) is formed on the wafer, a layer of polysilicon 74 (FG poly) is formed on oxide 72, and a layer of nitride 76 (FG nitride) is formed on poly layer 74, as shown in FIGS. 13A, 13B and 13C. The wafer is masked, leaving photo resist 78 on the wafer except on selected portions of the nitride 76 which are left exposed in the memory cell region 64. The exposed nitride 76 is etched using an appropriate nitride etch to expose portions of poly layer 74, as shown in FIGS. 14A, 14B and 14C. The exposed portions of poly layer 74 are oxidized using an oxidation process, forming oxide areas 80 on the FG poly. FIGS. 15A, 15B and 15C show the resulting structure after the photo resist 78 is removed. A nitride etch is used to remove the remaining nitride layer 76. An anisotropic poly etch is used to remove the poly layer 74 except those portions underneath the oxide areas 80 in the memory cell region 74, leaving blocks of polysilicon 74 that will constitute the floating gates of the memory cells, as shown in FIGS. 16A, 16B and 16C.

Figure 17A:
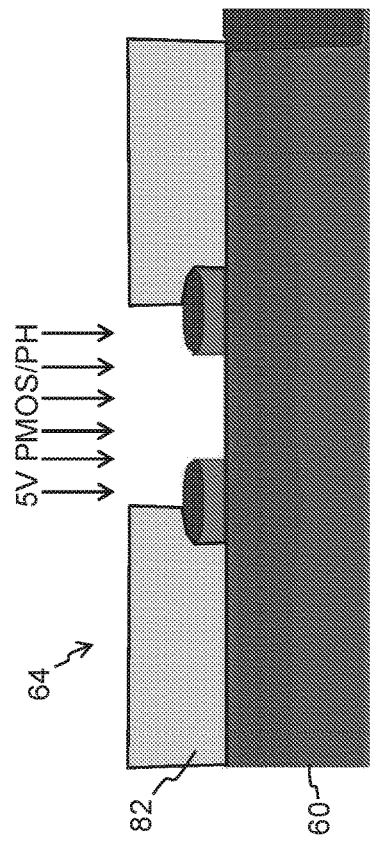
Figure 17B:
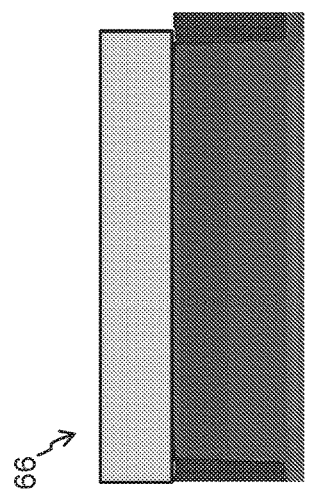
Figure 17C:
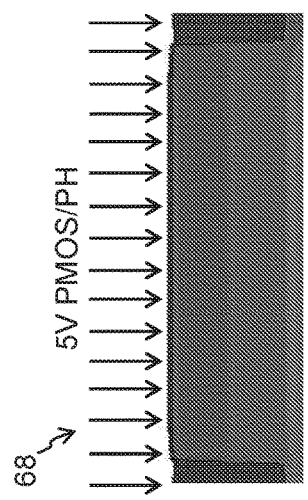

The wafer is then masked to cover the NMOS logic region 66, and the memory cell region (except for those areas between adjacent FG poly blocks), with photo resist 82. An implant (5V PMOS/PH) is performed on those areas left exposed by the photo resist 82, as shown in FIGS. 17A, 17B and 17C. After the photo resist 82 is removed, an oxide layer 84 is formed on the structure and the wafer. After additional masking and implant steps (Core PWEL for logic NMOS and LVOX for open core oxide region), a layer of polysilicon is deposited over the wafer. The structure is masked leaving portions of the poly layer exposed, which are then removed by a poly etch. The remaining portions of the poly layer constitute the control gates 86a in the memory cell region 64, and the logic gates 86b and 86c in the NMOS and PMOS logic regions 66 and 68 respectively. The resulting structure is shown in FIGS. 18A, 18B and 18C (after the photo resist has been removed).

Figure 19A:
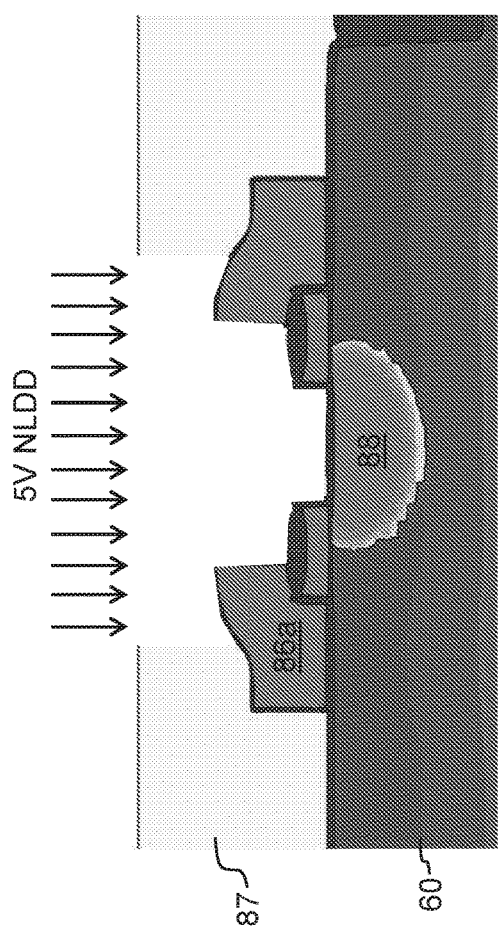
Figure 19C:
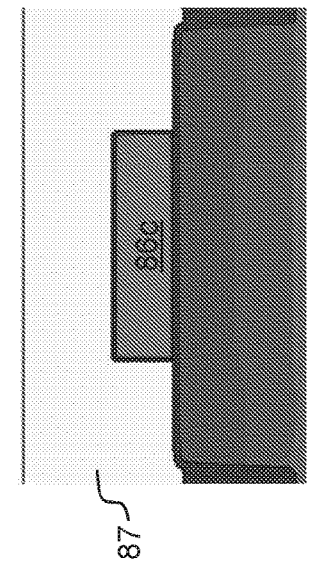
Figure 19B:
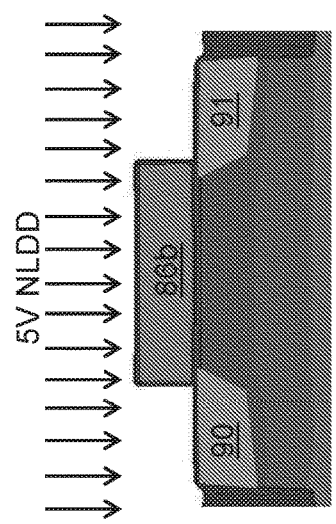

After an additional masking and implant step (Core NLDD for logic NMOS and LDD), the structure is masked again leaving only the NMOS region 66 and those areas between adjacent floating gate poly blocks 74 in the memory cell region 64 exposed by photo resist 87, followed by a 5V NLDD implantation to form the source regions 88 in the portions of the substrate between the floating gate poly blocks 74 in the memory cell region 64 and to form the source and drain regions 90 and 91 in the NMOS logic region 66, as shown in FIGS. 19A, 19B and 19C. After the photo resist 87 is removed, and after an additional masking and implant step (Core PLDD), the structure is masked to leave only the PMOS logic region 68 exposed from photo resist 92. This is followed by a 5V PLLD PH implantation to form source and drain regions 94 and 95 in the PMOS logic region 68, as shown in FIGS. 20A, 20B and 20C. The purpose of the NLDD and PLLD implants is to mitigate the effect of hot carrier injection (HCI) damage and make the effective channel length shorter.

Figure 21A:
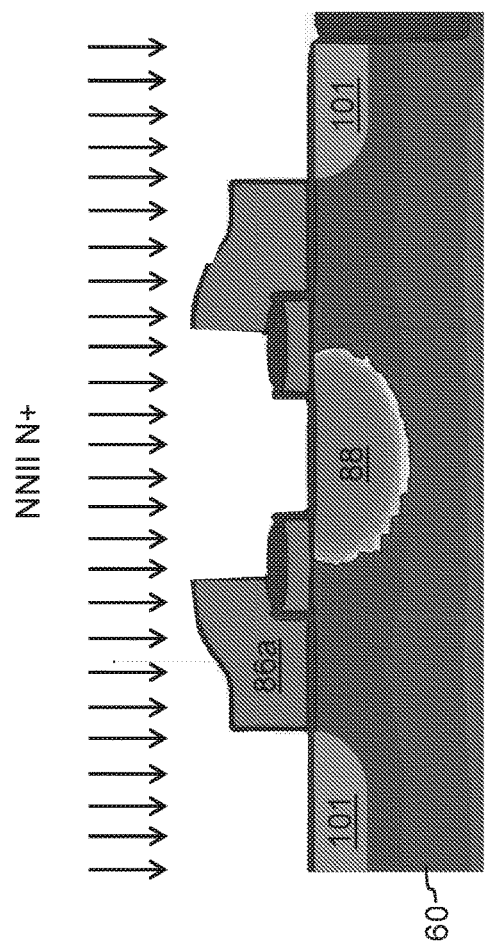
Figure 21C:
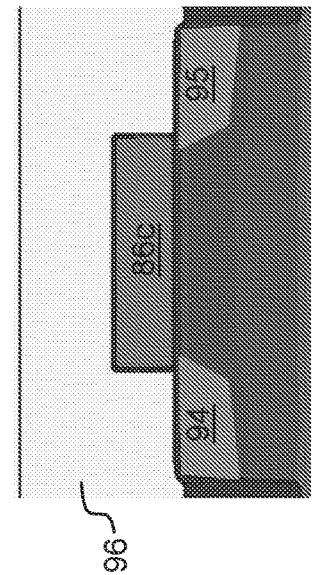
Figure 21B:
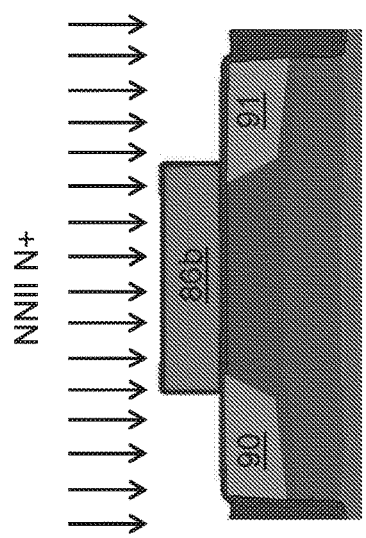
Figure 22A:
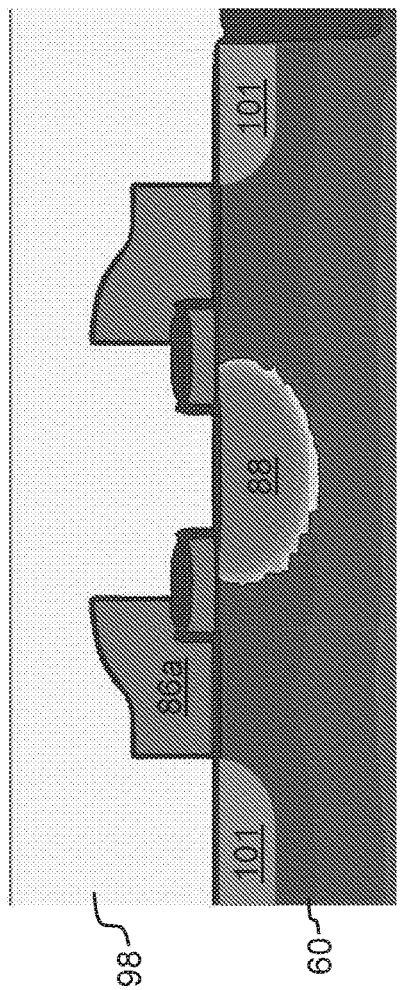
Figure 22C:
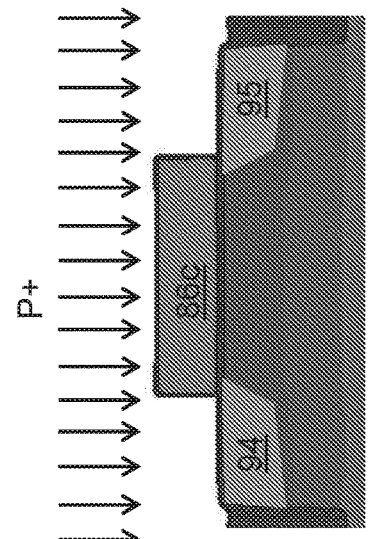
Figure 22B:
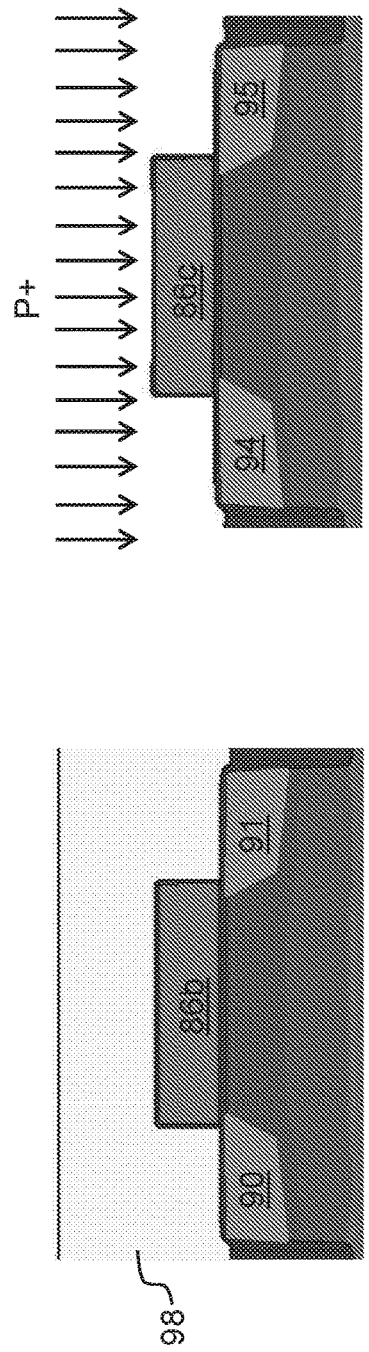

After photo resist 92 is removed, the structure is masked to cover PMOS logic region 66 with photo resist 96, which is followed by an implantation (NNII-N+) to enhance the source region 88 and form drain regions 101 in the memory cell region 64, and enhance the source and drain regions 90 and 91 in the NMOS logic region 66, as shown in FIGS. 21A, 21B and 21C. After the photo resist 96 is removed, the wafer is masked with photo resist 98 except for the PMOS logic region 68, and a P+ implantation is used to enhance the source/drain regions 94/95 in the PMOS logic region 68, as illustrated in FIGS. 22A, 22B and 22C.

The process continues by forming insulation spacers 100 (e.g. by oxide deposition and etch), silicide layers 102 on the poly blocks 86a, 86b and 86c and on all source/drain regions, and insulation layers 104-107, as shown in FIGS. 23A, 23B and 23C. This back end processing includes at least two more masking steps (silicide blocking to limit silicide formation, and back end processing for etching through insulation layers 104-107 to create contact holes 108 through the insulation over the drain regions in the memory cell region and over the source/drain regions in the logic device regions).

By forming high voltage logic devices that operate at a lower voltage (e.g. 5 volts) than done in the prior art (e.g. 12 volts), it allows for certain logic region implantations to be shared with the memory cell region that could not be shared before. These different sharing arrangements allow for a reduction of masking steps from 22 down to 15 in forming the memory cells and logic devices on the same wafer.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed. Additionally, the above method is illustrated with an N type substrate and P wells formed in the memory cell region and the NMOS logic region. However, a P type substrate can be used, in which case an N well can be formed in the PMOS logic region. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a memory device, comprising:
   providing a semiconductor substrate having a memory region, a first logic region and a second logic region;
   forming a pair of spaced apart floating gates in the memory region;
   forming a pair of control gates in the memory region, wherein each control gate has a first portion adjacent to one of the floating gates and a second portion that extends up and over one of the floating gates;
   forming a first logic gate in the first logic region;
   forming a second logic gate in the second logic region;
   forming a first photo resist that covers the second logic region and portions of the substrate adjacent to the control gates in the memory region, but not the first logic region and not a portion of the substrate between the pair of floating gates;
   performing a first implantation that forms a source region in the substrate between the pair of floating gates, a source region in the substrate adjacent a first side of the first logic gate, and a drain region in the substrate adjacent a second side of the first logic gate opposite the first side of the first logic gate;
   removing the first photo resist;
   forming a second photo resist that covers the first logic region and the memory region, but not the second logic region;
   performing a second implantation that forms a source region in the substrate adjacent a first side of the second logic gate and a drain region in the substrate adjacent a second side of the second logic gate opposite the first side of the second logic gate;
   removing the second photo resist;
   forming a third photo resist that covers the second logic region, but not the memory region and not the first logic region;

performing a third implantation that forms drain regions in the substrate adjacent the control gates;
removing the third photo resist.

2. The method of claim 1, further comprising:
forming a forth photo resist that covers the first logic region and the memory region, but not the second logic region;
performing a fourth implantation that enhances the source region in the substrate adjacent the first side of the second logic gate and enhances the drain region in the substrate adjacent the second side of the second logic gate.

3. The method of claim 2, wherein the third implantation enhances the source region in the memory region, enhances the source region and the drain region adjacent the first logic gate.

4. The method of claim 2, wherein:
wherein the first implantation results in a lower doping of the substrate than that of the third implantation;
wherein the second implantation results in a lower doping of the substrate than that of the fourth implantation.

5. The method of claim 2, wherein the substrate is N type, the method further comprising:
forming a fifth photo resist that covers the second logic region but not the memory cell region or the first logic region;
performing a fifth implantation that forms a first P well in the substrate in the memory cell region and a second P well in the substrate in the first logic region.

6. The method of claim 5, wherein:
the first implantation is an N type implantation;
the second implantation is a P type implantation;
the third implantation is an N+ type implantation; and
the fourth implantation is a P+ type implantation.

7. The method of claim 2, wherein the substrate is P type, the method further comprising:
forming a fifth photo resist that covers the memory cell region and the first logic region, but not the second logic region;
performing a fifth implantation that forms an N well in the substrate in the second logic region.

8. The method of claim 7, wherein:
the first implantation is an N type implantation;
the second implantation is a P type implantation;
the third implantation is an N+ type implantation; and
the fourth implantation is a P+ type implantation.

9. The method of claim 1, further comprising:
forming insulation on the memory region, the first logic region and the second logic region;
removing selected portions of the insulation to form first contact holes extending through the insulation to the drain regions in the memory region, second contact holes extending through the insulation to the source and drain regions in the first logic region, and third contact holes extending through the insulation to the source and drain regions in the second logic region.

10. The method of claim 1, further comprising:
forming silicide on upper surfaces of the control gates, on an upper surface of the first logic gate, and on an upper surface of the second logic gate.

11. The method of claim 1, further comprising:
forming silicide on surface portions of the substrate over the source region adjacent the first side of the first logic gate, the drain region adjacent the second side of the first logic gate, the source region adjacent the first side of the second logic gate, the drain region adjacent the second side of the second logic gate, and the drain regions adjacent the control gates.

* * * * *

UNITED STATES PATENT AND TRADEMARK OFFICE
CERTIFICATE OF CORRECTION

PATENT NO.         : 9,570,592 B2                                 Page 1 of 1
APPLICATION NO.    : 15/164796
DATED              : February 14, 2017
INVENTOR(S)        : Nhan Do and Vipin Tiwari It is certified that error appears in the above-identified patent and that said Letters Patent is hereby corrected as shown below:

In the Specification

Column 1
Line 62, the phrase "poly layer 24" should read -- poly layer 26 --.

Column 2
Line 28, the phrase "poly blocks 36a" should read -- poly blocks 24 --.
Line 44, the phrase "memory cell region 16" should read -- memory cell region 14 --.

Column 4
Line 24, the word "tranches" should read -- trenches --.
Line 54, the phrase "memory cell region 74" should read -- memory cell region 64 --.

In the Claims

Column 7
Line 5, the word "forth" should read -- fourth --.

Signed and Sealed this
Twenty-seventh Day of June, 2017

Joseph Matal
*Performing the Functions and Duties of the
Under Secretary of Commerce for Intellectual Property and
Director of the United States Patent and Trademark Office*